United States Patent
Furuie

(10) Patent No.: US 9,735,217 B2
(45) Date of Patent: Aug. 15, 2017

(54) ORGANIC ELECTROLUMINESCENT DISPLAY DEVICE

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/974,689

(22) Filed: Dec. 18, 2015

(65) Prior Publication Data

US 2016/0181340 A1  Jun. 23, 2016

(30) Foreign Application Priority Data

Dec. 18, 2014  (JP) ................................. 2014-256219

(51) Int. Cl.
  *H01L 51/52*  (2006.01)
  *H01L 27/32*  (2006.01)

(52) U.S. Cl.
  CPC ...... *H01L 27/3258* (2013.01); *H01L 51/5253* (2013.01)

(58) Field of Classification Search
  CPC .............. H01L 27/3248; H01L 27/3258; H01L 27/3265; H01L 27/3276; H01L 51/5253
  See application file for complete search history.

(56) References Cited

U.S. PATENT DOCUMENTS

| 2003/0122140 | A1* | 7/2003 | Yamazaki | H01L 21/67207 257/88 |
| 2003/0230764 | A1* | 12/2003 | Yamazaki | H01L 27/3244 257/200 |
| 2005/0023964 | A1 | 2/2005 | Omura | |
| 2006/0076887 | A1* | 4/2006 | Kang | H01L 27/3246 313/512 |
| 2010/0320909 | A1* | 12/2010 | Izumi | H01L 27/3246 315/51 |
| 2011/0057186 | A1* | 3/2011 | Yamazaki | H01L 27/1225 257/43 |
| 2013/0249877 | A1* | 9/2013 | Choi | G09G 3/20 345/205 |

FOREIGN PATENT DOCUMENTS

JP  2004-335267 A  11/2004
JP  2006-302860 A  11/2006

* cited by examiner

*Primary Examiner* — Allan R Wilson
(74) *Attorney, Agent, or Firm* — Typha IP LLC

(57) ABSTRACT

An organic electroluminescent display device includes a display area including a plurality of pixels, a peripheral area as an area on the outside of the display area, a circuit layer including a circuit formed in the display area and a circuit formed in the peripheral area, a planarization film formed in the display area, the planarization film covering the circuit in the display area but not covering at least a portion of the circuit in the peripheral area, and an inorganic insulating layer formed of an inorganic material, the inorganic insulating layer being formed in the peripheral area and covering the at least a portion of the circuit in the peripheral area.

6 Claims, 4 Drawing Sheets

ORGANIC ELECTROLUMINESCENT DISPLAY DEVICE

CROSS-REFERENCE TO RELATED APPLICATION

The present application claims priority from Japanese application JP2014-256219 filed on Dec. 18, 2014, the content of which is hereby incorporated by reference into this application.

BACKGROUND OF THE INVENTION

1. Field of the Invention

The present invention relates to an organic electroluminescent display device.

2. Description of the Related Art

In many organic electroluminescent display devices, a planarization film is formed on a circuit including wires and TFTs (thin Film Transistors), and an organic layer including pixel electrodes and a light-emitting layer is formed on the planarization film. A common electrode is formed on the organic layer. Since the planarization film is formed of an organic material, the planarization film may serve as a permeation path of moisture. When moisture passes through the planarization film and reaches the organic layer, the organic layer is degraded.

In JP 2004-335267 A, a groove located in an area (peripheral area) on the outside of a display area is formed in the planarization film. The permeation path of moisture into the display area is blocked by this groove. In JP 2006-302860 A, the planarization film (organic material film 10) is separated for each of pixels, so that a diffusion path of moisture is blocked.

The organic electroluminescent display device includes, in the peripheral area, a circuit including TFTs and constituting a shift register or the like (this circuit is hereinafter referred to as "peripheral circuit"). The peripheral circuit is also covered by the planarization film. However, when the above-described groove for blocking the permeation path of moisture is formed in the planarization film, the peripheral circuit cannot be formed at the position of the groove. Therefore, the width of the peripheral area is increased by an amount corresponding to the width of the groove. This constitutes a limitation on narrowing a peripheral area portion of the organic electroluminescent display device.

SUMMARY OF THE INVENTION

It is an object of the invention to provide an organic electroluminescent display device capable of narrowing a peripheral area portion while suppressing the permeation of moisture into a display area.

An organic electroluminescent display device according to an aspect of the invention includes: a display area including a plurality of pixels; a peripheral area as an area on the outside of the display area; a circuit layer including a circuit formed in the display area and a circuit formed in the peripheral area; a planarization film formed in the display area, the planarization film covering the circuit in the display area but not covering at least a portion of the circuit in the peripheral area; and an inorganic insulating layer formed of an inorganic material, the inorganic insulating layer being formed in the peripheral area and covering the at least a portion of the circuit in the peripheral area.

According to the aspect of the invention, it is possible to narrow the peripheral area portion while suppressing the permeation of moisture into the display area.

DETAILED DESCRIPTION OF THE INVENTION

Figure 1:
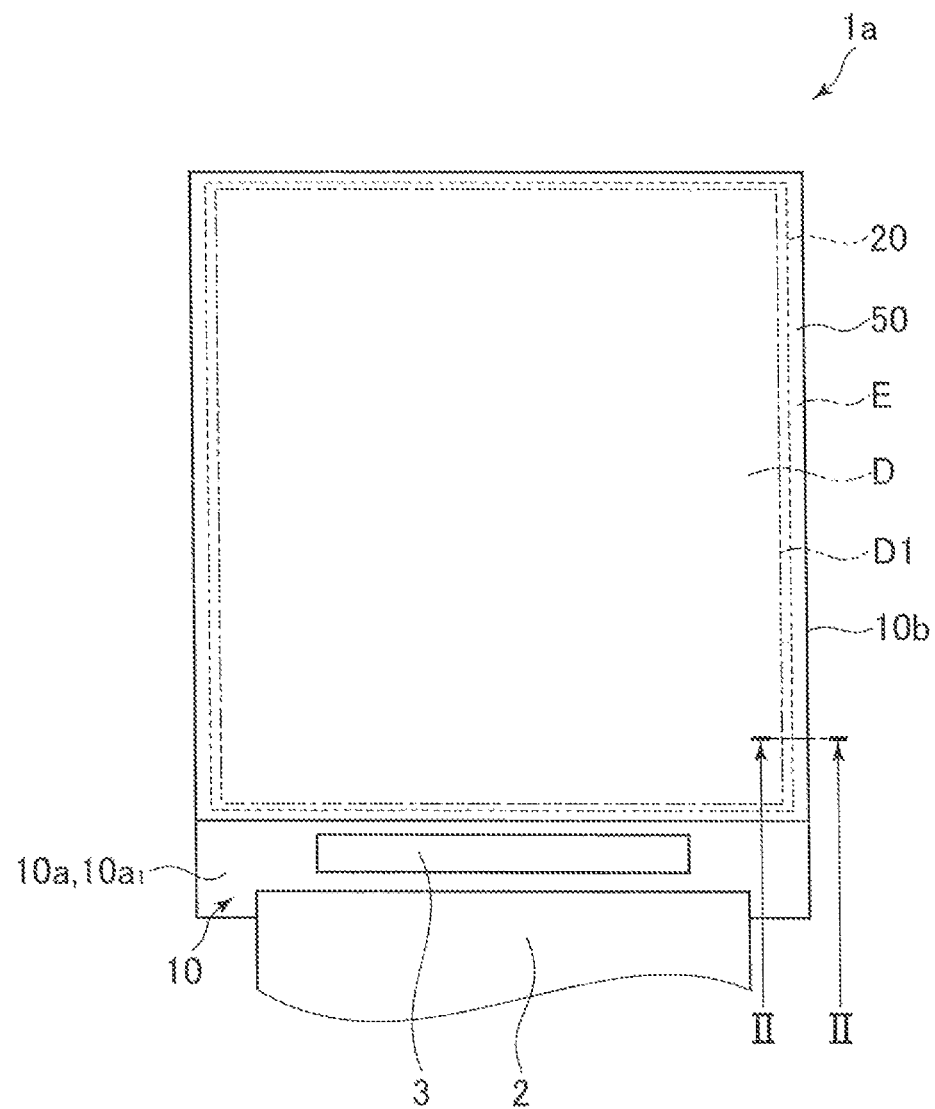
FIG. 1 is a schematic plan view of an organic electroluminescent display device according to a first embodiment.

Hereinafter, an organic electroluminescent display device 1a according to a first embodiment of the invention will be described based on the drawings. In the drawings referred to in the following description, a portion having a feature is shown in an enlarged manner in some cases for convenience sake to facilitate the understanding of the feature. Therefore, the dimension ratio or the like of each component is not always the same as that of an actual one.

Moreover, materials or the like illustrated in the following description are merely examples. Each component may be different from the illustrated example, and can be implemented by modifications within the range not changing the gist thereof. In the embodiment, the positional relationship of configurations will be described using coordinates on an X-axis (X1 direction and X2 direction), a Y-axis (Y1 direction and Y2 direction), and a Z-axis (Z1 direction and Z2 direction) for convenience of description.

Figure 2:
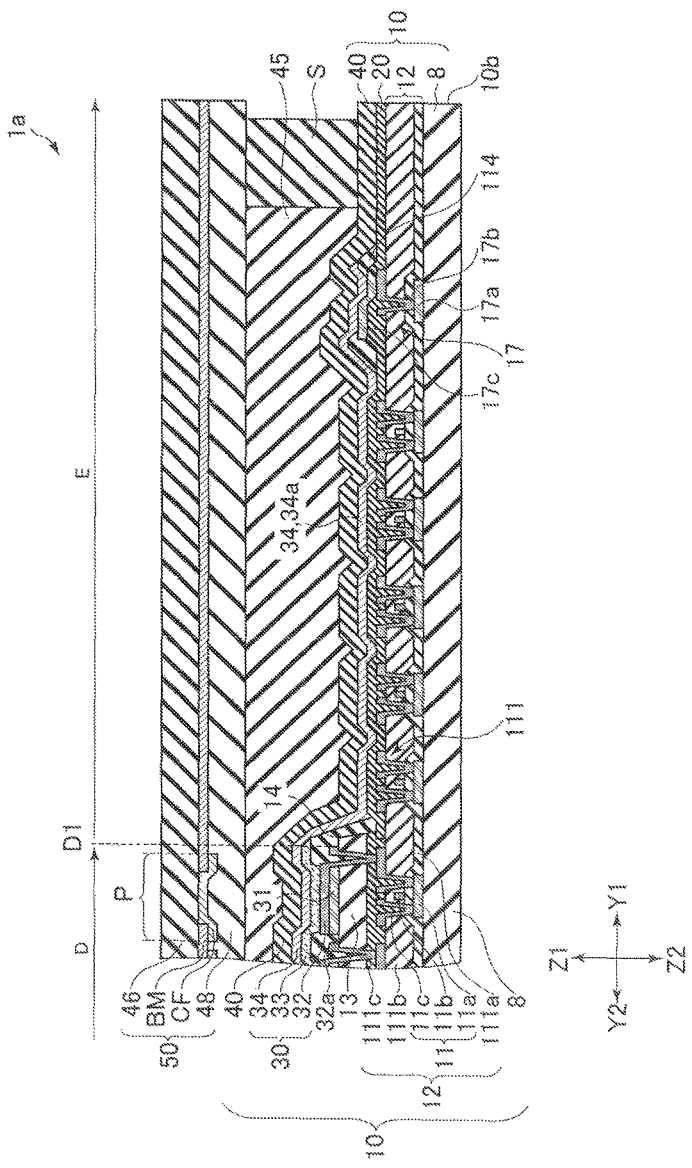
FIG. 2 is a schematic cross-sectional view of the organic electroluminescent display device shown in FIG. 1, taken along the line II-II.

First, the configuration of the organic electroluminescent display device 1a in the first embodiment of the invention will be described. FIG. 1 is a schematic plan view of the organic electroluminescent display device 1a according to the first embodiment. FIG. 2 is a schematic cross-sectional view of the organic electroluminescent display device 1a shown in FIG. 1, taken along the line II-II.

The organic electroluminescent display device 1a of the embodiment includes a TFT substrate 10 and a counter substrate 50 as shown in FIG. 1. The TFT substrate 10 includes a display area D including a plurality of pixels P, and a peripheral area E as an area on the outside of the display area D.

The plan-view shape of the TFT substrate 10 is larger than the plan-view shape of the counter substrate 50. For this reason, an area 10a1 as a portion (portion in the X2 direction in FIG. 1) of an upper surface 10a of the TFT substrate 10 is not covered by the counter substrate 50 but is exposed. A flexible circuit board 2 is connected to the area 10a1, and further, a driver IC (Integrated Circuit) 3 is provided therein.

The driver IC 3 is an IC supplied with image data from the outside of the organic electroluminescent display device 1a through the flexible circuit board 2. In response to the supply of the image data, the driver IC 3 supplies a voltage signal to each of pixels through a data line (not shown).

Hereinafter, the configuration of the display area D will be described in detail with reference to FIG. 2. For convenience sake, the configuration of the peripheral area E will be described in detail later. In the display area D of the TFT substrate 10, an insulating substrate 8, a circuit layer 12, a planarization film 13, an organic electroluminescent element 30, and a sealing film 40 are formed. The display area D of the TFT substrate 10 is covered by the counter substrate 50 with a filler 45 therebetween.

The insulating substrate 8 is an insulative substrate on which the circuit layer 12 is formed. The circuit layer 12 is a layer including a circuit formed in the display area D. Examples of circuit elements constituting the "circuit" in the embodiment include, for example, a thin film transistor 11 described later, a wire (not shown), and a contact hole 32a.

In the display area D of the circuit layer 12, the thin film transistor 11 and insulating films 111a, 111b, and 111c are formed. The thin film transistor 11 is a transistor for driving the organic electroluminescent element 30, and is disposed for each of the pixels P. The thin film transistor 11 includes, for example, a semiconductor layer 11a, a gate electrode 11b, and a source/drain electrode 11c.

The top of the circuit layer 12 in the display area D is covered by the planarization film 13 having insulating properties. For this reason, the circuit in the display area D is covered by the planarization film 13, so that the circuit including the thin film transistor 11 and the organic electroluminescent element 30 are electrically insulated from each other. The planarization film 13 is made of an organic material having insulating properties such as acrylic resin or polyimide.

A reflection film 31 may be formed on an upper surface of the planarization film 13 in an area corresponding to each of the pixels P. The reflection film 31 is a film that reflects light emitted from the organic electroluminescent element 30 to the counter substrate 50 side. The reflection film 31 preferably has a higher optical reflectance, and is preferably a metal film made of, for example, aluminum, silver (Ag), or the like.

A plurality of organic electroluminescent elements 30 are formed on the planarization film 13. The organic electroluminescent element 30 includes a pixel electrode 32 made of a light-transmissive conductive material such as IZO, an organic layer 33 including at least a light-emitting layer, and a common electrode 34 made of a light-transmissive conductive material such as IZO.

The pixel electrode 32 is an electrode formed corresponding to each of the pixels P. The pixel electrode is supplied with a drive current from the thin film transistor 11 through the contact hole 32a. When the reflection film 31 is made of a conductive material, the reflection film 31 functions as a portion of the pixel electrode 32.

A pixel separation film 14 extends between the pixel electrodes 32 along the boundary between the pixels P adjacent to each other. With this configuration, the pixel electrodes 32 adjacent to each other are electrically insulated from each other.

Although the organic electroluminescent element 30 shown in FIG. 2 includes the organic layer 33 formed over the plurality of pixels P, the configuration of the organic layer 33 is not limited to such an example. The organic layer 33 may be one obtained by coating, in areas corresponding to the pixels P, plural kinds of light-emitting layers that emit light of different colors.

The common electrode 34 in the embodiment is formed in both the display area D and the peripheral area E. The common electrode 34 in the display area D is formed so as to cover the top of the organic layer 33 over the plurality of pixels P.

An upper surface (surface on the Z1 side in the drawing) of the common electrode 34 is covered by the sealing film 40 over the plurality of pixels. The sealing film 40 is a film that prevents the entry of moisture into the organic layer 33 or the planarization film 13 from the upper direction (the Z1 side in the drawing). The sealing film 40 is made of, for example, silicon nitride (SiN).

The top of the sealing film 40 is covered by the counter substrate 50 with, for example, the filler 45 therebetween. Examples of the counter substrate 50 include, for example, a substrate including a color filter. When the counter substrate 50 is the substrate including a color filter, the counter substrate 50 includes, for example, a glass substrate 46, a light-impermeable film BM provided in a grid pattern on a lower surface (surface on the Z2 side in the drawing) of the glass substrate 46, colored films R, G, and B divided in a matrix by the light-impermeable film BM, and a light-transmissive protective film 48 covering the lower surface side of the colored films R, G, and B.

Next, the configuration of the peripheral area E will be described. In the peripheral area E of the TFT substrate 10, the insulating substrate 8, the circuit layer 12, an inorganic insulating layer 20, a peripheral portion 34a of the common electrode 34, and the sealing film 40 are formed. The peripheral area E of the TFT substrate 10 is covered by the counter substrate 50 with the filler 45 therebetween. Hereinafter, a description of configurations similar to those of the display area D is omitted, and different configurations will be described in detail.

In the peripheral area E of the circuit layer 12, circuit elements such as wires (not shown), thin film transistors 111, and a contact portion 17 are formed. The contact portion 17 in the embodiment is a circuit element that connects the wire with the common electrode 34.

In the peripheral area E, the thin film transistors 111 are arranged from an edge D1 of the display area D toward the outside (outer perimeter 10b side). The configuration of the thin film transistor 111 is the same as, for example, the thin film transistor 11 in the display area D, and therefore, a description of the thin film transistor 111 is omitted.

The contact portion 17 is electrically connected to the wire and the peripheral portion 34a of the common electrode 34. The peripheral portion 34a is a portion of the common electrode 34 formed in the peripheral area E. With this configuration, the wire in the peripheral area E is connected with the common electrode 34 through the contact portion 17.

The contact portion 17 includes connecting portions 17a and 17b and a contacting portion 17g that contacts the peripheral portion 34a. An edge of the contacting portion 17g is covered by an insulative bank 114. Although the contact portion 17 in the embodiment is formed on the outside (the outer perimeter 10b side) of the other circuit elements (circuit elements different from the contact portion 17), the forming place of the contact portion 17 is not limited to this example.

In the embodiment, the top of the contact portion 17 and the tops of the other circuit elements are covered by the inorganic insulating layer 20 instead of the planarization film 13. The inorganic insulating layer 20 is an insulative layer formed of an inorganic material. Examples of the material of the inorganic insulating layer 20 include, for example, SiN and $SiO_2$, but any other materials may be used as long as the material is an inorganic material having a moisture permeability lower than that of the material of the planarization film 13 and having insulating properties.

The inorganic insulating layer 20 is preferably formed so as to cover the entire peripheral area E as shown in FIG. 2. However, a portion covered by the planarization film 13 may be present as long as at least a portion of the circuit elements in the peripheral area E is covered by the inorganic insulating layer 20 instead of the planarization film 13.

The peripheral portion 34a of the common electrode 34 is formed in a higher layer than the inorganic insulating layer 20. For this reason, the circuit elements in the peripheral area E and the peripheral portion 34a are electrically insulated from each other by the inorganic insulating layer 20 even when the planarization film 13 is not provided.

An upper surface of the peripheral portion 34a in the peripheral area E is covered by the sealing film 40. The top of the sealing film 40 is covered by the counter substrate 50 with the filler 45 therebetween. A sealing material S is disposed between the sealing film 40 and the counter substrate 50 to seal the filler 45.

In the organic electroluminescent display device 1a of the embodiment, at least a portion of the circuit elements in the peripheral area E is covered by the inorganic insulating layer 20 instead of the planarization film 13. With this configuration, it is possible, in an area where the inorganic insulating layer 20 is formed, to prevent the permeation of moisture from the outer perimeter 10b side of the TFT substrate 10 into the display area D while maintaining insulating properties between the circuit elements and the peripheral portion 34a.

For this reason, it is not necessary to provide a groove for blocking a permeation path of moisture in the peripheral area E. Thus, narrowing the picture frame of the organic electroluminescent display device 1a can be realized.

The inorganic insulating layer 20 preferably surrounds an entire outer perimeter of the display area D in a plan view as shown in FIG. 1. With this configuration, the permeation of moisture from the outer perimeter 10b side of the TFT substrate 10 into the display area D is prevented in all directions in the plan view. The inorganic insulating layer 20 may be provided only at a portion at which the other circuit elements such as the thin film transistor 111 are formed.

Figure 3:
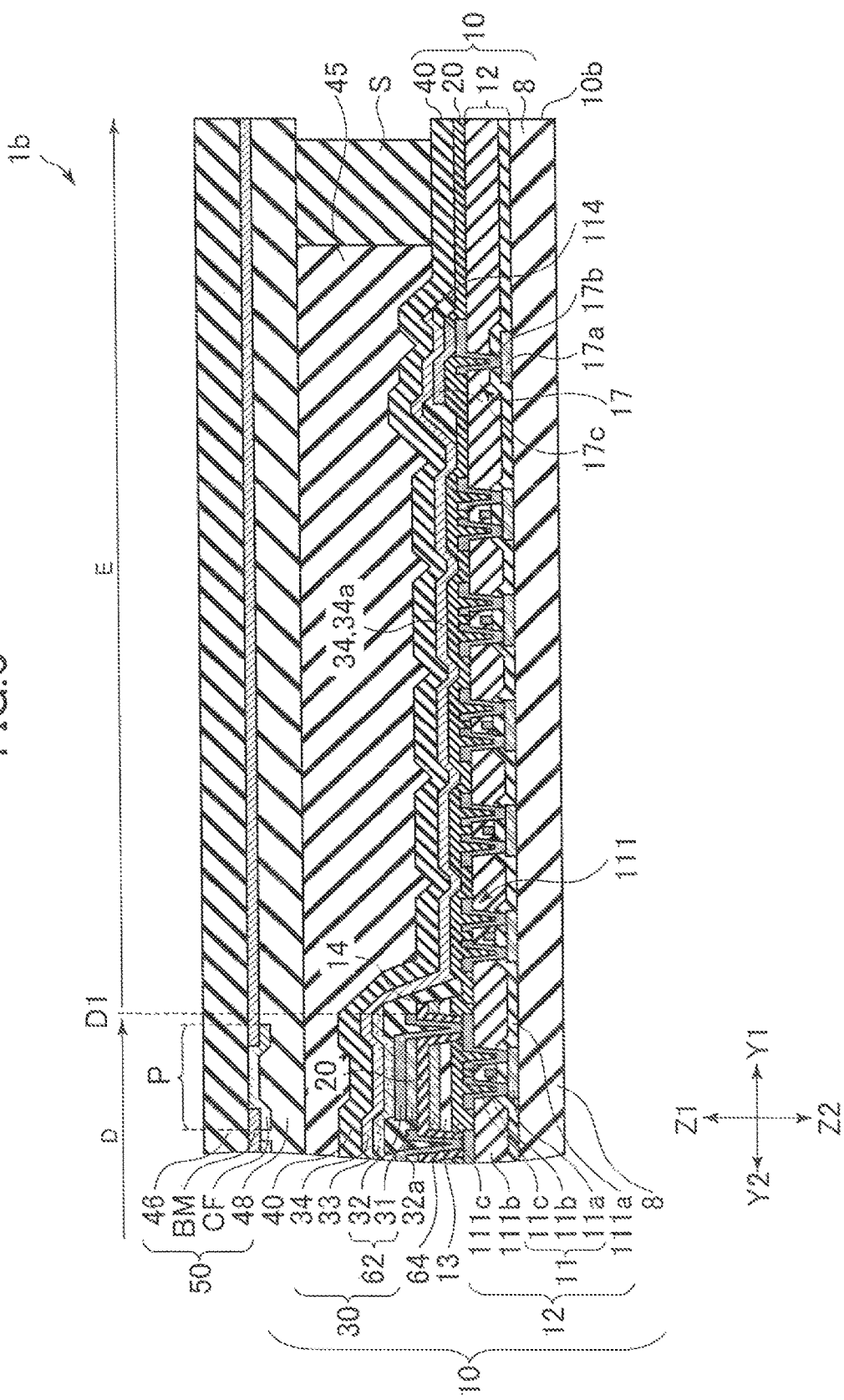
FIG. 3 is a schematic cross-sectional view showing an organic electroluminescent display device according to a second embodiment in the same field of view as FIG. 2.

Next, an organic electroluminescent display device 1b in a second embodiment will be described. FIG. 3 is a schematic cross-sectional view showing the organic electroluminescent display device 1b according to the second embodiment in the same field of view as FIG. 2. Hereinafter, a description of the same configurations as those of the organic electroluminescent display device 1a in the first embodiment is omitted, and portions having different configurations will be described.

The organic electroluminescent display device 1b in the embodiment differs from the organic electroluminescent display device 1a in the first embodiment in that another conductive layer 64 is formed in a lower layer than the pixel electrode 32, and that the inorganic insulating layer 20 is formed between the conductive layer 64 and the pixel electrode 32. Hereinafter, the conductive layer including the pixel electrode 32 (the reflection film 31 and the pixel electrode 32 in the embodiment) is referred to as "first conductive layer 62", while the conductive layer 64 is referred to as "second conductive layer 64".

The second conductive layer 64 is a layer that forms an auxiliary capacitance together with the pixel electrode 32. As the material of the second conductive layer 64, for example, a conductive material such as IZO is used. The second conductive layer 64 in the embodiment is formed so as to cover the upper surface of the planarization film 13.

The inorganic insulating layer 20 in the embodiment is formed in both the peripheral area E and the display area D. The inorganic insulating layer 20 in the display area D and the inorganic insulating layer 20 in the peripheral area E are formed in the same process. For this reason, the inorganic insulating layer 20 in the display area D is continuous with the inorganic insulating layer 20 in the peripheral area E.

As shown in FIG. 3, the inorganic insulating layer 20 in the display area D is formed so as to cover the top of the second conductive layer 64, and the first conductive layer 62 is formed so as to cover the top of the inorganic insulating layer 20.

Since the inorganic insulating layer 20 is formed between the first conductive layer 62 and the second conductive layer 64 as described above, the first conductive layer 62 (the reflection film 31 and the pixel electrode 32) and the second conductive layer 64 are electrically insulated from each other by the inorganic insulating layer 20. For this reason, the inorganic insulating layer 20 in the display area D functions as an insulator for forming a capacitance between the first conductive layer 62 and the second conductive layer 64.

With this configuration, a pixel capacitance of the organic electroluminescent display device 1b in the embodiment is larger than a pixel capacitance of an organic electroluminescent display device not having this configuration.

Figure 4:
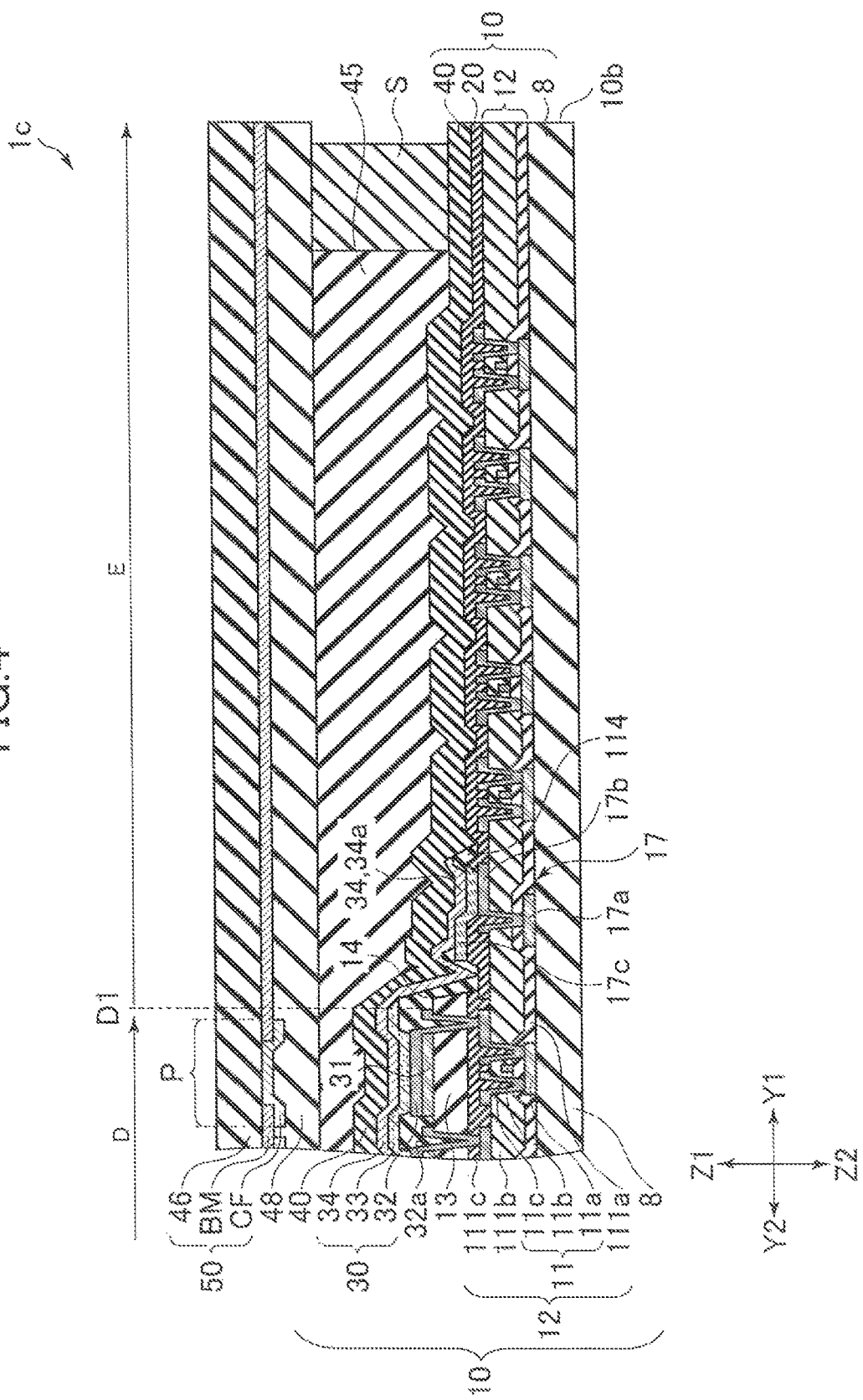
FIG. 4 is a schematic cross-sectional view showing an organic electroluminescent display device according to a third embodiment in the same field of view as FIG. 2.

Next, an organic electroluminescent display device 1c in a third embodiment will be described. FIG. 4 is a schematic cross-sectional view showing the organic electroluminescent display device 1c according to the third embodiment in the same field of view as FIG. 2. Hereinafter, a description of the same configurations as those of the organic electroluminescent display device 1a in the first embodiment is omitted, and portions having different configurations will be described.

The organic electroluminescent display device 1c in the embodiment differs from the organic electroluminescent display device 1a in the first embodiment in that in the cross-sectional view as shown in FIG. 4, the contact portion 17 among the plurality of circuit elements such as the thin film transistor 111 is disposed closest to the display area D.

The contact portion 17 is connected to an edge of the peripheral portion 34a. The other circuit elements such as the thin film transistor 111 are located on the outside (the outer perimeter 10b side) of the contact portion 17. Therefore, on the outside (the outer perimeter 10b side) of the contact portion 17, the other circuit elements such as the thin film transistor 111 do not face the peripheral portion 34a.

Hence, a capacitance is not formed between the other circuit elements such as the thin film transistor 111 and the peripheral portion 34a in the peripheral area E. For this reason, the flexibility of arrangement of the other circuit elements can be increased in the peripheral area E.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescent display device comprising:
    a display area including a plurality of pixels;
    a peripheral area as an area on the outside of the display area;
    a circuit layer including a circuit formed in the display area and a circuit formed in the peripheral area;
    a planarization film formed in the display area, the planarization film covering the circuit in the display area but not covering at least a portion of the circuit in the peripheral area; and an inorganic insulating layer formed of an inorganic material, the inorganic insulating layer being formed in the peripheral area and covering the at least a portion of the circuit in the peripheral area, wherein a first conductive layer and a second conductive layer facing the first conductive layer are formed in the display area, and the inorganic insulating layer is formed between the first conductive layer and the second conductive layer and insulates the first conductive layer and the second conductive layer from each other.

2. The organic electroluminescent display device according to claim 1, wherein the first conductive layer includes a pixel electrode, the second conductive layer is disposed in a lower layer than the pixel electrode and forms a capacitance together with the pixel electrode, and the inorganic insulating layer is formed between the first conductive layer and the second conductive layer.

3. An organic electroluminescent display device comprising:

a display area including a plurality of pixels;

a peripheral area as an area on the outside of the display area;

a circuit layer including a circuit formed in the display area and a circuit formed in the peripheral area;

a planarization film formed in the display area, the planarization film covering the circuit in the display area but not covering at least a portion of the circuit in the peripheral area;

an inorganic insulating layer formed of an inorganic material, the inorganic insulating layer being formed in the peripheral area and covering the at least a portion of the circuit in the peripheral area; and a common electrode formed over a plurality of pixels in the display area, the common electrode including a peripheral portion formed in the peripheral area, the common electrode being formed in a higher layer than the planarization film and the inorganic insulating layer, wherein the circuit layer includes, in the peripheral area, a wire, a contact portion, and a circuit element different from the contact portion, the contact portion being connected to the peripheral portion of the common electrode and connecting the wire with the common electrode, and the contact portion is disposed closer to the display area than the different circuit element is.

4. The organic electroluminescent display device according to claim 3, wherein the circuit layer includes, as the different circuit element, a plurality of circuit elements arranged from an edge of the display area toward the outside in the peripheral area, and the contact portion is disposed closer to the display area than the plurality of circuit elements are.

5. The organic electroluminescent display device according to claim 1, wherein the inorganic insulating layer surrounds an entire outer perimeter of the display area in a plan view.

6. An organic electroluminescent display device comprising:

a display area including a plurality of pixels;

a peripheral area outside of the display area;

a common electrode at least over the plurality of pixels;

a sealing film covering the common electrode and extending to the peripheral area;

a circuit layer including a circuit in the display area and another circuit in the peripheral area;

a planarization film covering the circuit in the display area but not covering at least a portion of the circuit in the peripheral area, the planarization film being made of an organic material having insulating properties; and an inorganic insulating layer in the peripheral area, the inorganic insulating layer covering the at least a portion of the circuit in the peripheral area which is not covered with the planarization film, the inorganic insulating layer having an edge opposite to the display area, the edge being covered with the sealing film in the peripheral area, wherein the inorganic insulating layer has a moisture permeability lower than the organic material of the planarization film.

* * * * *